United States Patent
Liu et al.

(10) Patent No.: US 7,326,636 B2
(45) Date of Patent: Feb. 5, 2008

(54) METHOD AND CIRCUIT STRUCTURE EMPLOYING A PHOTO-IMAGED SOLDER MASK

(75) Inventors: Ling Liu, Colorado Springs, CO (US); Albert An-Bon Yeh, Colorado Springs, CO (US); Paul Thomas Carson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 66 days.

(21) Appl. No.: 11/135,967

(22) Filed: May 24, 2005

(65) Prior Publication Data

US 2006/0270079 A1    Nov. 30, 2006

(51) Int. Cl.
*H01L 21/44* (2006.01)
*H01L 23/48* (2006.01)

(52) U.S. Cl. ............ 438/612; 438/614; 438/382; 257/737; 257/772

(58) Field of Classification Search ......... 438/612, 438/613, 614, 674, 675, 676, 382; 257/737, 257/738, 772, 779, 780

See application file for complete search history.

(56) References Cited

U.S. PATENT DOCUMENTS

| | | | | |
|---|---|---|---|---|
| 4,582,778 A | * | 4/1986 | Sullivan | 430/273.1 |
| 4,971,895 A | * | 11/1990 | Sullivan | 430/328 |
| 5,587,342 A | * | 12/1996 | Lin et al. | 438/125 |
| 6,228,678 B1 | * | 5/2001 | Gilleo et al. | 438/613 |
| 6,593,220 B1 | * | 7/2003 | Yu et al. | 438/612 |
| 2003/0232492 A1 | * | 12/2003 | Venkateswaran | 438/612 |
| 2005/0133572 A1 | * | 6/2005 | Brese et al. | 228/180.22 |
| 2005/0277245 A1 | * | 12/2005 | Ohta et al. | 438/222 |

* cited by examiner

*Primary Examiner*—Kevin M. Picardat

(57) ABSTRACT

In one embodiment, a photo-imageable material is deposited on a circuit structure. The photo-imageable material is then exposed to a pattern of radiation, thereby polymerizing portions of the photo-imageable. Un-polymerized portions of the photo-imageable material are then removed to define a solder mask having solder deposition areas. Solder is then deposited in the solder deposition areas. A circuit structure that may be produced in accordance with this method is also disclosed.

18 Claims, 7 Drawing Sheets

METHOD AND CIRCUIT STRUCTURE EMPLOYING A PHOTO-IMAGED SOLDER MASK

BACKGROUND

With advances in ball grid array (BGA) technology, there is an increasing pressure to mount denser and higher performing devices on a circuit board. One popular BGA package or device is the ceramic BGA (CBGA) package, where an integrated circuit (IC) is mounted on a ceramic circuit board to take advantage of the electrical and thermal benefits offered by ceramic substrates over conventional plastic substrates.

One feature of constructing a CBGA package that is typically critical is the precise alignment of small solder balls that serve as interconnects between the package and a circuit board on which it is mounted. That is, the shape, position, and dimensional tolerances of both the solder balls, and the solder pads formed on the package to which the solder balls are attached, are often critical in producing a precisely defined and aligned ball grid array on the package.

The majority of CBGA packages are formed utilizing a multi-layer co-fired ceramic (MLCC) technology, where solder pads are deposited on a ceramic substrate in its "green" (soft) state. Subsequently, the ceramic substrate is fired and hardened. However, during firing, there is limited control over the shrinkage of the ceramic substrate, and the definition and alignment of the solder pads on the hardened ceramic may not match that of the pattern of solder pads that was originally applied to the "green" ceramic. See, for example, the before and after solder pad patterns shown in FIGS. 1 and 2, where the pattern shown in FIG. 2 illustrates the skew of solder pads (e.g., pads 102, 104, 106) as a result of shrinkage of the ceramic substrate 100.

A second process for depositing solder pads on a substrate is to screen print them on a hardened substrate (whether ceramic or otherwise). Thereafter, only the solder pads are affected by a curing or firing process. However, the relative positional accuracy and dimensional control of the solder pads are limited by factors such as screen stretch (leading to positional drifts) and screen mesh interference (leading to imprecise solder pad shapes, or slumping of a thick film after deposition). See, for example, the solder pad pattern shown in FIG. 3, where the pattern of solder pads shown in FIG. 1 has not been achieved on the substrate 300 as a result of screen stretch during the deposition of the solder pads (e.g., pads 302, 304, 306).

SUMMARY OF THE INVENTION

In one embodiment, a method comprises 1) depositing a photo-imageable material on a circuit structure, 2) exposing the photo-imageable material to a pattern of radiation, thereby polymerizing portions of the photo-imageable material, 3) removing un-polymerized portions of the photo-imageable material to define a solder mask having solder deposition areas, and 4) depositing solder in the solder deposition areas.

In another embodiment, a circuit structure comprises a substrate having one or more conductors exposed on a surface thereof. A photo-imaged solder mask 1) covers at least part of the substrate surface on which the conductor(s) are exposed, and 2) defines at least one solder deposition area that intersects one or more of the exposed conductors. Solder is deposited on the exposed conductors in the solder deposition area(s).

Other embodiments are also disclosed.

BRIEF DESCRIPTION OF THE DRAWINGS

Illustrative embodiments of the invention are illustrated in the drawings, in which.

DETAILED DESCRIPTION

Figure 1:
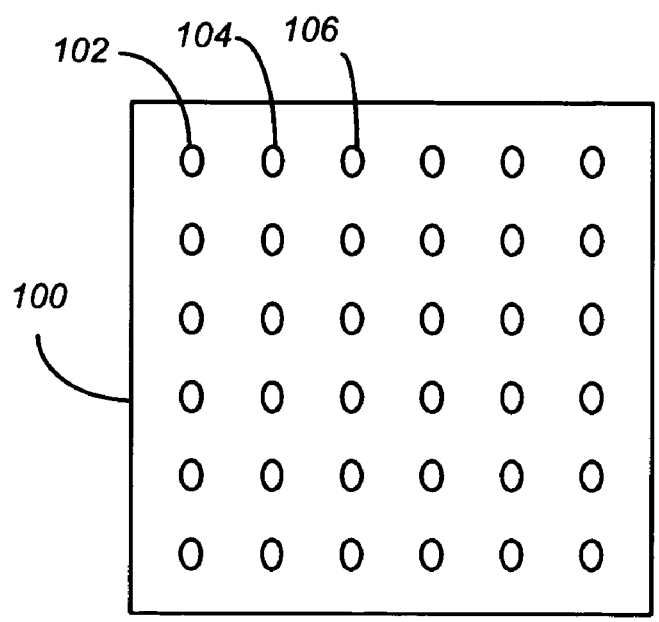
FIG. 1 illustrates a plan view of an exemplary substrate on which a pattern of solder pads has been deposited.
Figure 2:
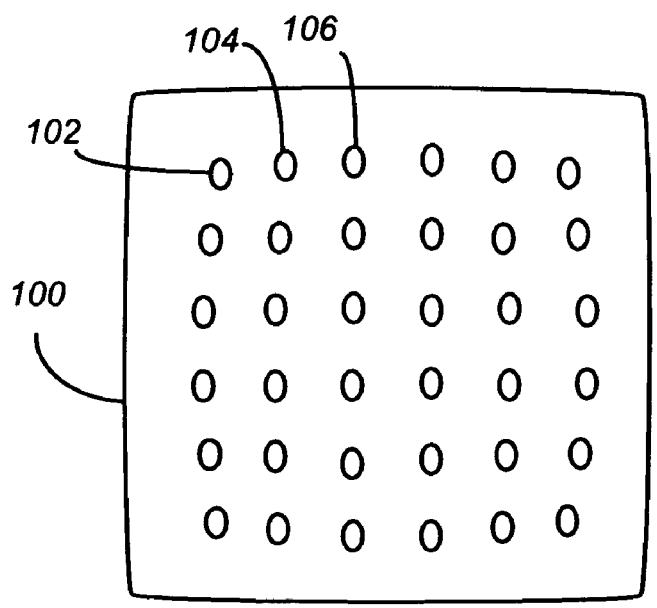
FIG. 2 illustrates the solder pads of FIG. 1 after shrinkage of their supporting substrate.
Figure 3:
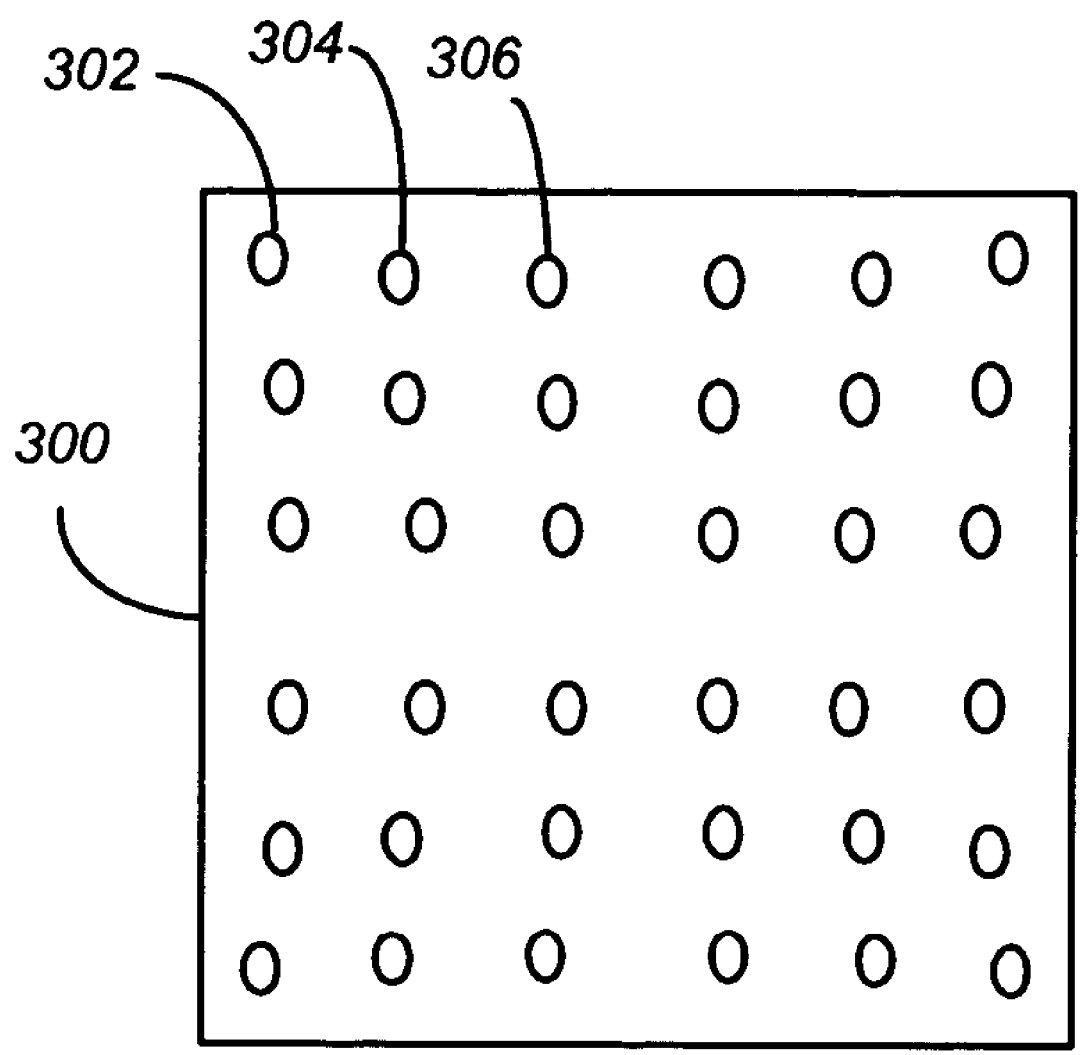
FIG. 3 illustrates the solder pads of FIG. 1 as a result of screen stretch during their deposition.
Figure 4:
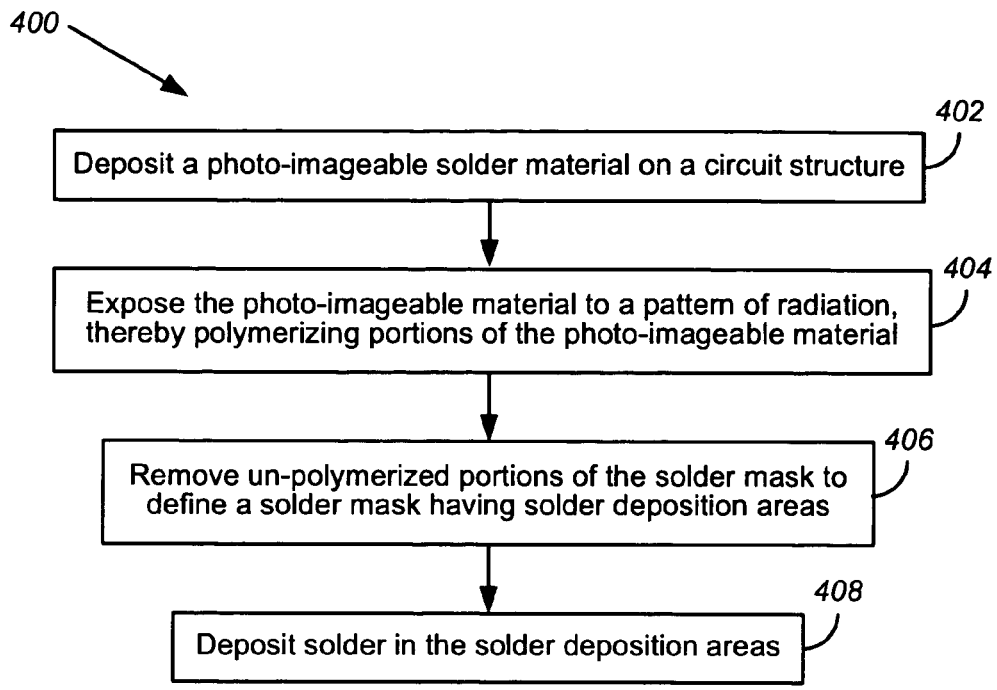
FIG. 4 illustrates an exemplary method that employs a photo-imaged solder mask.

FIG. 4 illustrates an exemplary method 400 that may be used to form solder pads on a circuit structure. By way of example, the circuit structure may be one comprising a ceramic substrate, such as a multi-layer co-fired ceramic (MLCC) substrate.

The method 400 comprises 1) depositing 402 a photo-imageable material on the circuit structure, 2) exposing 404 the photo-imageable material to a pattern of radiation, thereby polymerizing portions of the photo-imageable material, 3) removing 406 un-polymerized portions of the photo-imageable material to define a solder mask having solder deposition areas, and then 4) depositing 408 solder in the solder deposition areas.

An exemplary application of the method 400 is illustrated in FIGS. 5A-5I, which illustrate various stages of a circuit structure 500 that may be constructed in accord with the method 400.

Figure 5A:
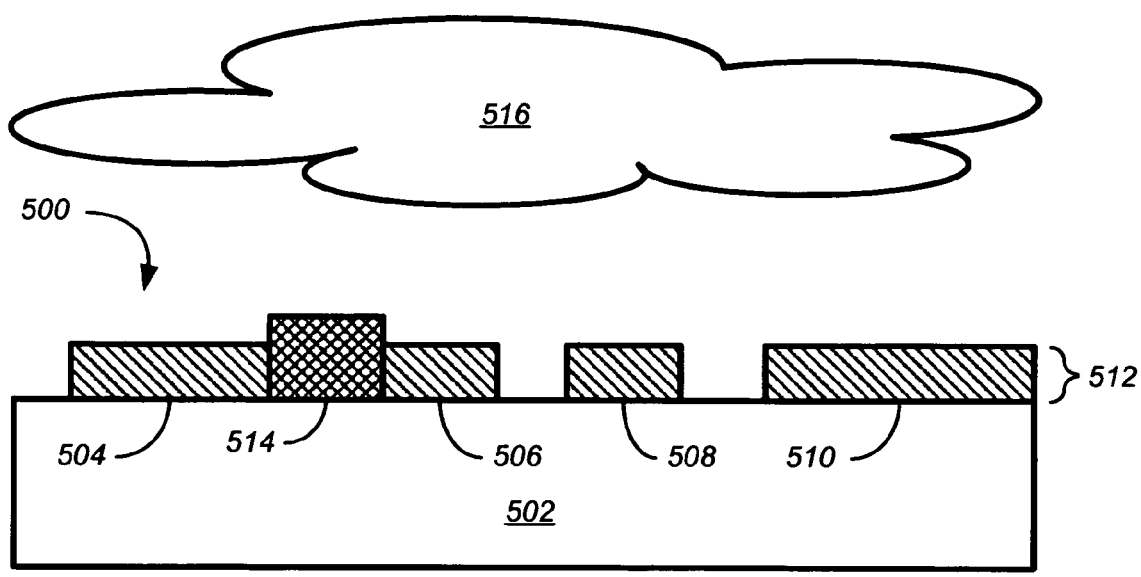
FIGS. 5A-5I illustrate various stages of a circuit structure that may be constructed in accord with the FIG. 4 method.

FIG. 5A illustrates an exemplary circuit structure 500 comprising a substrate 502. By way of example, the substrate 502 is shown to have one or more conductors therein (e.g., vias) or thereon, at least some of which present (i.e., are exposed) on one surface of the substrate 502. In some cases, the conductors 504, 506, 508, 510 may be part of a thick film circuit layer 512 formed on the substrate 502. By way of example, the thick film circuit layer 512 of the structure 500 is shown to comprise a thick film resistor 514 that, by way of example, is an untrimmed thick film resistor.

Before depositing a photo-imageable material 518 on the circuit structure 500, the structure 500, or at least an area (e.g., surface) of the structure 500 on which the photo-imageable material is to be deposited, may be cleaned. In one embodiment, this is done using an oxygen ($O_2$) plasma 516.

Figure 5B:
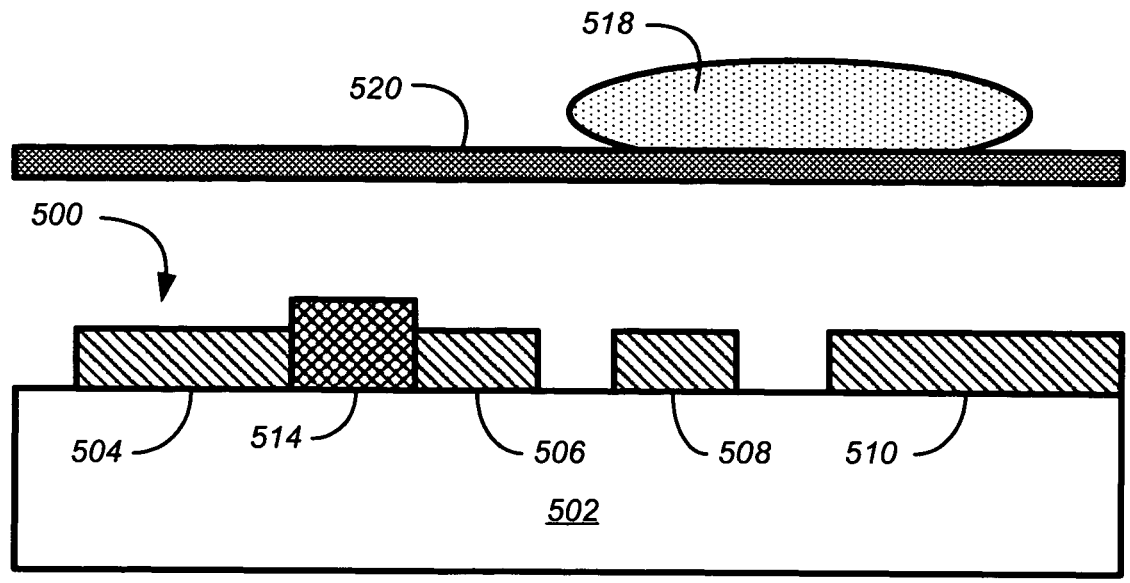

Referring now to FIG. 5B, a photo-imageable material 518 may be deposited on the circuit structure 500 by means of a screen printing process (e.g. by depositing the material 518 through a fine mesh screen 520). Alternately, the material 518 could be deposited by means of a spray coating or curtain coating process.

Figure 5C:
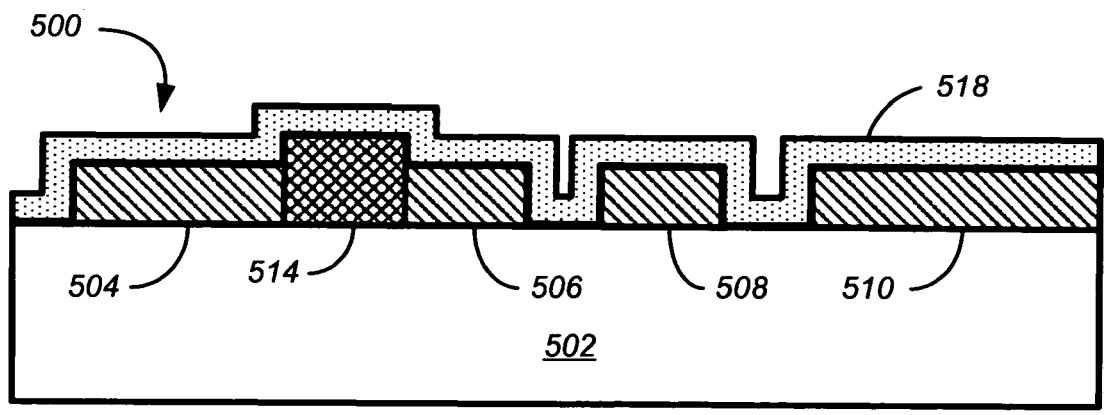
Figure 5D:
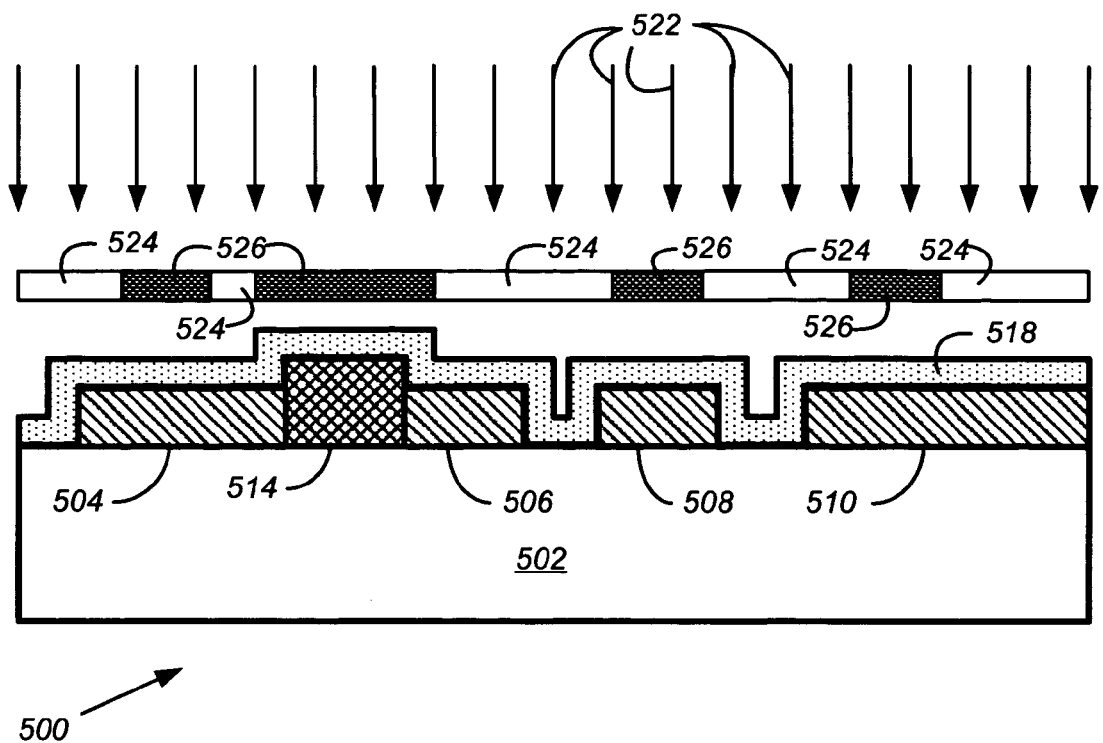
Figure 5E:
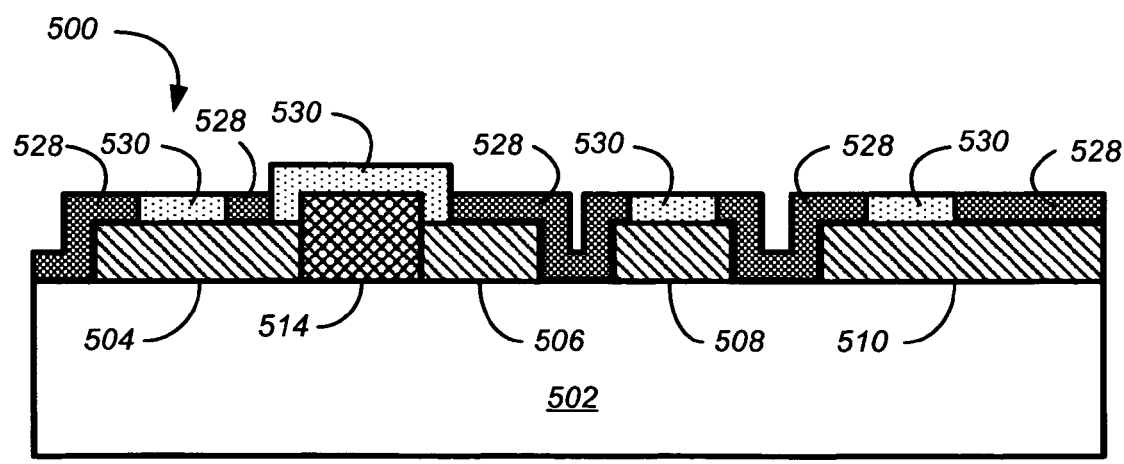
Figure 5F:
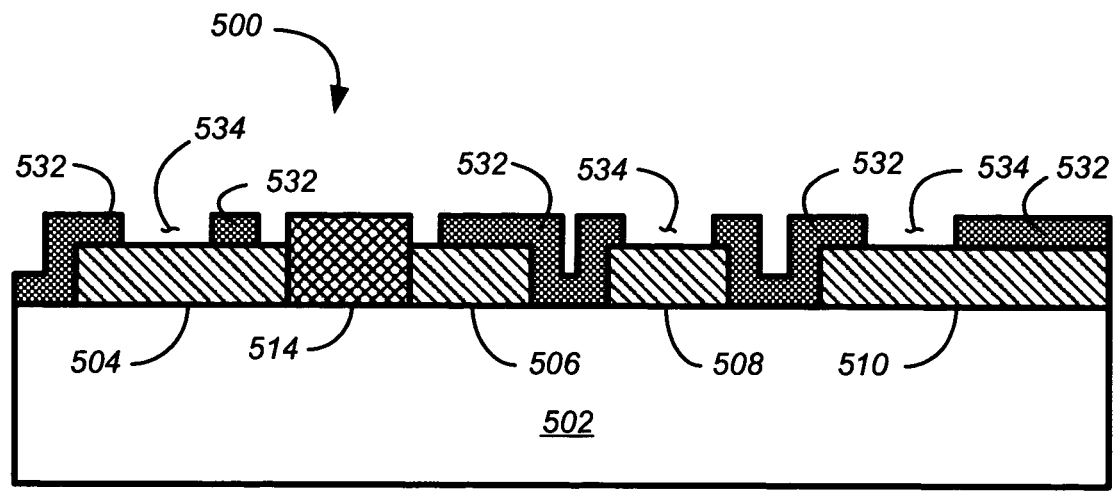
Figure 5G:
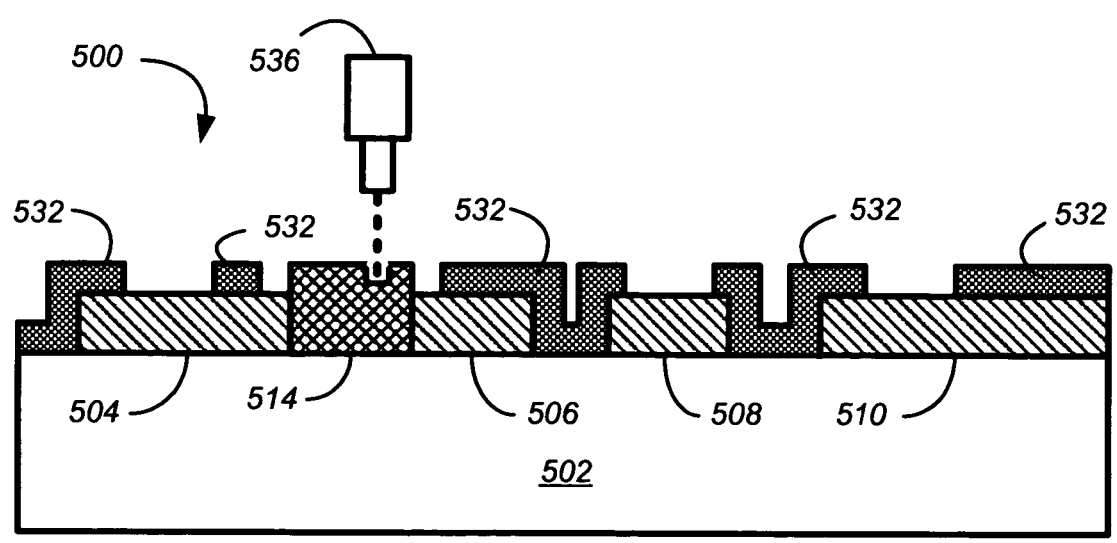
Figure 5H:
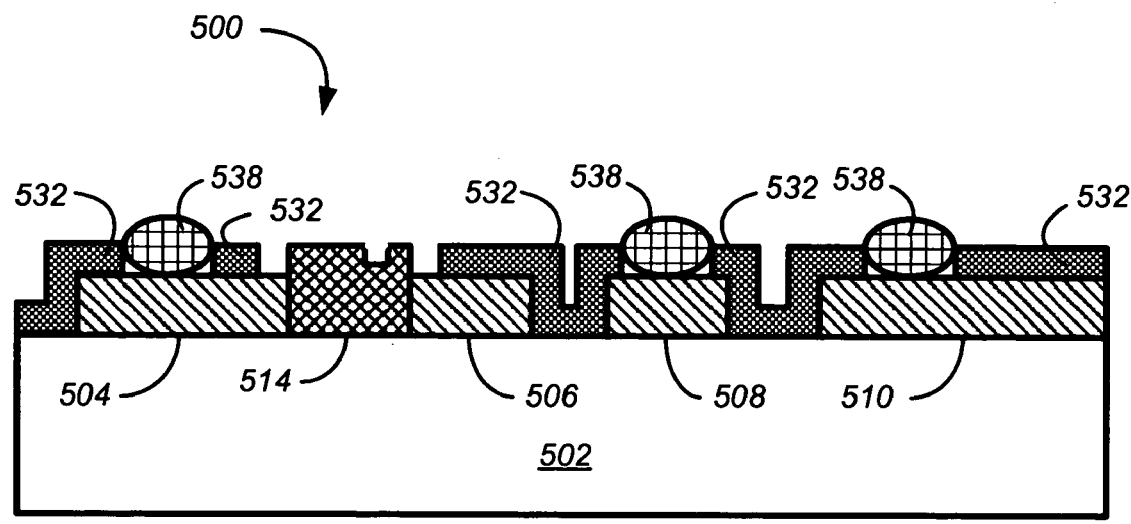
Figure 5I:
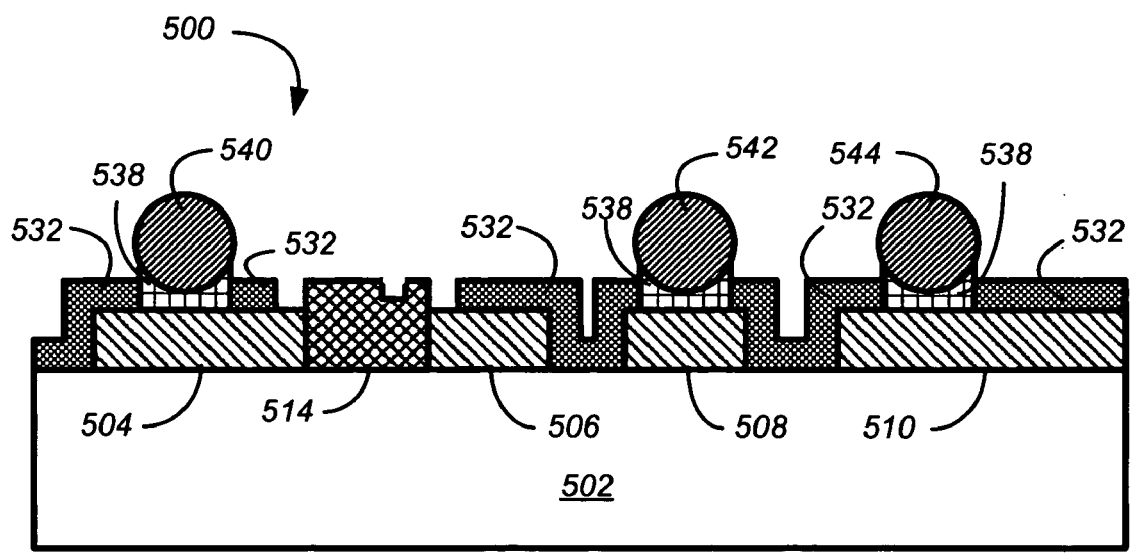

After deposition, the photo-imageable material 518 may appear as shown in FIG. 5C. Although it may often be preferable to have the material 518 cover the entirety (or substantial entirety) of a surface of the circuit structure 500, the material 518 could alternately be deposited such that it covers only portions of the circuit structure 500. In one embodiment, the photo-imageable material 518 is deposited in liquid form, and then cured (e.g., by air drying or heating) to a solid form prior to its exposure to radiation. The liquidity of the material 518 may be adjusted depending on the circuit structure to which it is being applied. Preferably, the material 518 should be thin enough to penetrate and coat finer cavities formed between the conductors 504-510, elements 514 and any surface variations of the circuit structure 500. However, the material 518 must also be thick enough to enable its deposition at a desired thickness—which thickness should be maintainable until the material 518 is cured.

After deposition of the photo-imageable material 518, it may then be exposed to a pattern of radiation to thereby polymerize portions 528 of the material 518. See FIGS. 5D and 5E. One way to expose the material 518 to radiation is by transmitting ultraviolet light 522 through a mask element 524 that defines a pattern of radiation (e.g., via holes in the mask element 524). Other ways to expose the material 518 to radiation are also known in the art. Sometimes, the nature of the photo-imageable material 518 will dictate the type of radiation to which the material 518 needs to be exposed.

After irradiation, the un-polymerized portions 530 of the material 518 are removed to define a solder mask 532 having solder deposition areas 534. See FIG. 5F. Un-polymerized portions 530 of the material 518 may also be removed to expose at least a portion of the untrimmed thick film resistor 514. After removing the un-polymerized portions 530, the solder mask 532 may be cured (e.g., via drying or heating).

If the solder mask 532 exposes a thick film resistor 514, the resistor may be trimmed as necessary using, for example, a laser 536. See FIG. 5G.

Finally, solder 538 (e.g., a solder paste mixed with flux) may be deposited in the solder deposition areas 534 to form solder pads. See FIG. 5H. One or more solder balls 540, 542, 544 or other circuit elements may then be placed on the solder pads, and the solder 538 may be reflowed to cause firm attachment of the solder balls 540, 542, 544 to the circuit structure 500. See FIG. 5I. The completed assembly may then be washed to remove any flux residue.

The method 400 and circuit structure 500 can be advantageous in that they allow solder pads to be shaped and positioned more precisely than other methods. Furthermore, the method used to define the solder mask is not subject to machine wear or deformation, as may be the case when using a screen printing process. Nor are the deposited solder pads subject to shrinkage as a result of "green" ceramic firing or the like.

The method 400 is based on a subtraction technology, where material is removed rather than added to form the shape of a solder pad. As a result, the solder mask is not subject to paste slump or screen mesh interference, as is possible in standard thick film printing operations. Solder pads may therefore be defined more closely to ideal.

What is claimed is:

1. A method, comprising:
   depositing a photo-imageable material on a thick film circuit layer having at least one untrimmed thick film resistor;
   exposing the photo-imageable material to a pattern of radiation, thereby polymerizing portions of the photo-imageable material;
   removing un-polymerized portions of the photo-imageable material to define a solder mask having solder deposition areas; and
   depositing solder in the solder deposition areas.

2. The method of claim 1, wherein the thick film circuit layer is formed on a ceramic substrate.

3. The method of claim 1, wherein the solder is deposited in the solder deposition areas to form solder pads in the solder deposition areas.

4. The method of claim 1, wherein un-polymerized portions of the photo-imageable material are also removed to expose at least a portion of the at least one untrimmed thick film resistor.

5. The method of claim 4, further comprising, after removing the un-polymerized portions of the photo-imageable material, and before depositing the solder, curing the polymerized portions of the solder mask and trimming at least one of the at least one thick film resistor that has been exposed through the solder mask.

6. The method of claim 1, further comprising, prior to depositing the photo-imageable material, using an oxygen plasma to clean at least an area of the thick film circuit layer on which the photo-imageable material is to be deposited.

7. The method of claim 1, wherein the photo-imageable material is deposited by means of a screen printing process.

8. The method of claim 1, wherein the photo-imageable material is deposited by means of a spray coating process.

9. The method of claim 1, wherein the photo-imageable material is deposited by means of a curtain coating process.

10. The method of claim 1, wherein the photo-imageable material is deposited in liquid form, and then cured to a solid form prior to its exposure to radiation.

11. The method of claim 1, wherein the photo-imageable material is exposed to the pattern of radiation through a mask element that defines the pattern of radiation.

12. The method of claim 1, wherein the radiation to which the photo-imageable material is exposed is ultraviolet light.

13. The method of claim 1, further comprising, after removing the un-polymerized portions of the photo-imageable material, and before depositing the solder, curing the polymerized portions of the solder mask.

14. The method of claim 1, further comprising:
   placing solder balls on the solder; and
   reflowing the solder.

15. A circuit structure, comprising:
   a ceramic substrate having one or more conductors exposed on a surface thereof;
   a photo-imaged solder mask i) covering at least part of the ceramic substrate surface on which the conductor(s) are exposed, ii) exposing at least a portion of at least one thick film resistor on the surface of the ceramic substrate, and iii) defining at least one solder deposition area that intersect one or more of the exposed conductors; and
   solder deposited on the exposed conductors in the solder deposition area(s).

16. The circuit structure of claim 15, wherein one or more solder balls are attached, via the solder, to the exposed conductors in the solder deposition areas.

17. The circuit structure of claim 15, wherein the conductors exposed on the surface of the substrate are thick film conductors.

18. The circuit structure of claim 15, wherein the solder forms solder pads in the solder deposition area(s).

* * * * *